United States Patent
Flanders et al.

(10) Patent No.: US 6,671,078 B2
(45) Date of Patent: Dec. 30, 2003

(54) ELECTROSTATIC ZIPPER ACTUATOR OPTICAL BEAM SWITCHING SYSTEM AND METHOD OF OPERATION

(75) Inventors: Dale C. Flanders, Lexington, MA (US); Martin A. Schmidt, Reading, MA (US)

(73) Assignee: Axsun Technologies, Inc., Billerica, MA (US)

( * ) Notice: Subject to any disclaimer, the term of this patent is extended or adjusted under 35 U.S.C. 154(b) by 150 days.

(21) Appl. No.: 09/863,654

(22) Filed: May 23, 2001

(65) Prior Publication Data

US 2002/0191267 A1 Dec. 19, 2002

(51) Int. Cl.$^7$ .............................................. G02B 26/00
(52) U.S. Cl. ...................................... 359/254; 359/245
(58) Field of Search ................................ 359/254, 230, 359/231, 245, 290; 348/203; 345/108, 48

(56) References Cited

U.S. PATENT DOCUMENTS

| | | | |
|---|---|---|---|
| 4,938,552 A | 7/1990 | Jebens et al. | 350/96.2 |
| 5,109,450 A | 4/1992 | Johann et al. | 385/52 |
| 5,237,234 A | 8/1993 | Jebens et al. | 310/309 |
| 5,380,396 A | 1/1995 | Shikida et al. | 156/630 |
| 5,446,811 A | 8/1995 | Field et al. | 385/23 |
| 5,835,256 A | * 11/1998 | Huibers | 359/291 |
| 6,057,520 A | 5/2000 | Goodwin-Johannson | 200/181 |
| 6,067,183 A | 5/2000 | Furlani et al. | 359/254 |
| 6,162,657 A | 12/2000 | Schiele et al. | 438/52 |
| 6,229,640 B1 | 5/2001 | Zhan | 359/290 |
| 6,245,444 B1 * | 6/2001 | Marcus et al. | 428/616 |
| 6,386,507 B2 * | 5/2002 | Dhuler et al. | 251/11 |

FOREIGN PATENT DOCUMENTS

| | | | |
|---|---|---|---|
| EP | 0 592 469 B1 | 5/1997 | F16K/11/02 |
| WO | 00/62410 | 10/2000 | H02N/1/00 |

OTHER PUBLICATIONS

Branebjerg, Jens; and Gravesen, Peter, "A New Electrostatic Actuator Providing Improved Stroke Length and Force," Micro Electro Mechanical Systems '92, Travemunde (Germany), Feb. 4–7, 1992.

Elwenspoek, M.; Weustink, M.; and Legtenberg, R., "Static and Dynamic Properties of Active Joints," The 8$^{th}$ International Conference on Solid–State Sensors and Actuators, and Eurosensors IX. Stockholm, Sweden, Jun. 25–29, 1995.

Grade, John D.; and Jerman, Hal, "A Large–Deflection Electrostatic Actuator for Optical Switching Applications," Solid–State Sensor and Actuator Workshop, Hilton Head Island, South Carolina, Jun. 4–8, 2000.

Legtenbert, Rob; Gilbert, John; Senturia, Stephen D.; and Elwenspoek, Miko, "Electrostatic Curved Electrode Actuators," Journal of Microelectromechanical Systems, vol. 6, No. 3, Sep. 1997, pp. 257–265.

Legtenberg, Rob; Berenschot, Erwin; Elwenspoek, Miko; and Fluitman, Jan, "Electrostatic Curved Electrode Actuators," MESA Research Institute, University of Twente, P.O. Box 217, 7500 AE Enschede, The Netherlands (1995).

Sato, Kazuo; and Shikida, Mitsuhiro, "Electrostatic Film Actuator with a Large Vertical Displacement," Micro Electro Mechanical Systems '92, Travemunde (Germany), Feb. 4–7, 1992.

(List continued on next page.)

*Primary Examiner*—Scott J. Sugarman
*Assistant Examiner*—Richard Hanig
(74) *Attorney, Agent, or Firm*—J. Grant Houston

(57) ABSTRACT

A zipper actuator for optical beam control has an optical port formed through the substrate. The cantilevered beam of the actuator preferably includes a paddle for switching the optical signal. Mirror structures can be provided on the paddle for beam switching. In some embodiments, MEMS or electrode latches are further provided.

26 Claims, 9 Drawing Sheets

OTHER PUBLICATIONS

Schimkat, Joachim, Kiesewetter, Lothar; Gevatter, Hans-Jurgen; Arndt, Frank; Steckenborn, Arno; Schlaak, Helmut F., "Moving Wedge Actuator: An Electrostatic Actuator for Use in a Microrelay," Proc. $4^{th}$ Int. Conf. and Exhibition on Micro Electro, Opto Mechanical Syst. And Components, Berlin, Germany, Oct. 19–21, 1994, pp. 989–996.

Chen, R.; Nguyen, H.; and Wu, M., "A High–Speed Low–Voltage Stress–Induced Micromachined 2 +2 Optical Switch," IEEE Photonics Technology Letters, vol. 11, No. 11, Nov. 1999.

Jin, Y; Seo, K.; Cho, Y; Lee, S.; Song, K; and Bu, J.; "An SOI Optical Microswitch Integrated with Silicon Waveguides and Touch–down Micromirror Actuators," IEEE LEOS Conference, 2000.

Perregaux, G.; Gonseth, S.; Debergh, P.; Thiébaud, J., and Vuilliomenet, H., "Arrays of Addressable High–Speed Optical Microshutters," IEEE MEMS Conference, Jan. 2001.

Schiele, I; and Hillerich, B, "Comparison of Lateral and Vertical Switches for Application as Microrelays," J. Micromech. Microeng. 9 (1999) 146–150.

Gilbert, J.R.; and Senturia, S.D., "Two–Phase Actuators: Stable Zipping Devices Without Fabrication of Curved Structures," Solid–State Sensor and Actuator Workshop, Jun. 1996, Hilton Head S.C. pp. 98–100.

Tas, N.; Elwenspoek, M.; and Legtenberg, R., "Side–wall Spacers for Stiction Reduction in Surface Micromachined Mechanisms," Proc. Micromechanics Workshop MME 1996, Barcelona, Spain, Oct. 21–22, 1996, pp. 92–95.

* cited by examiner

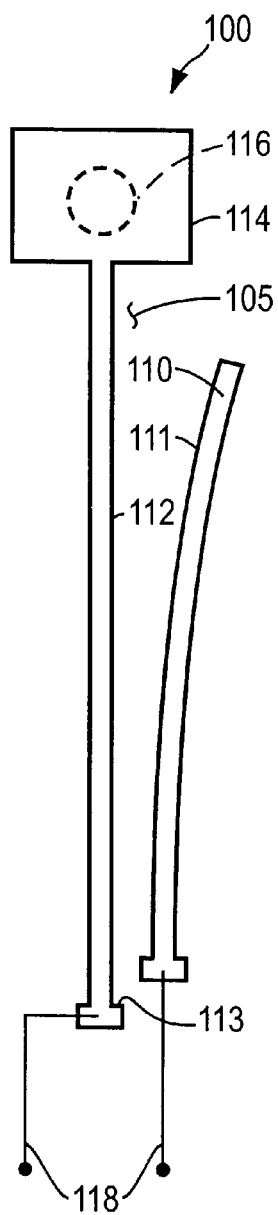
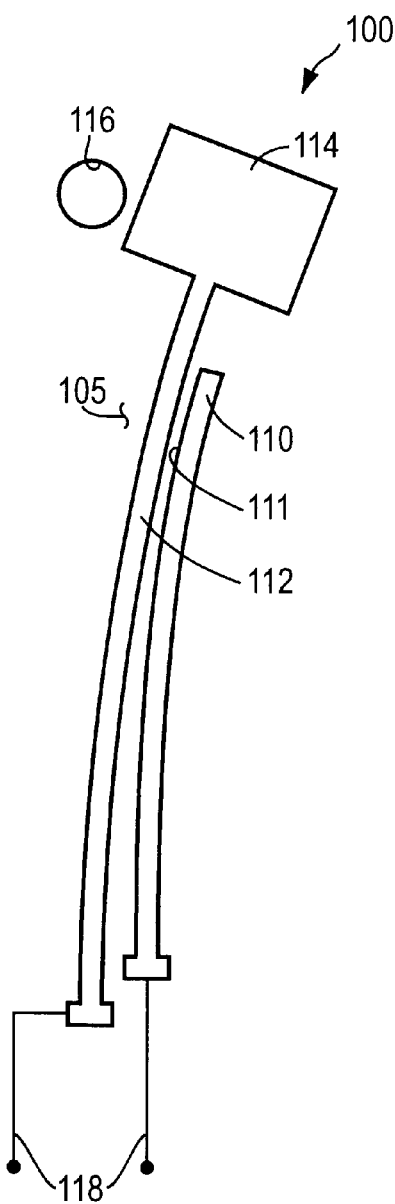
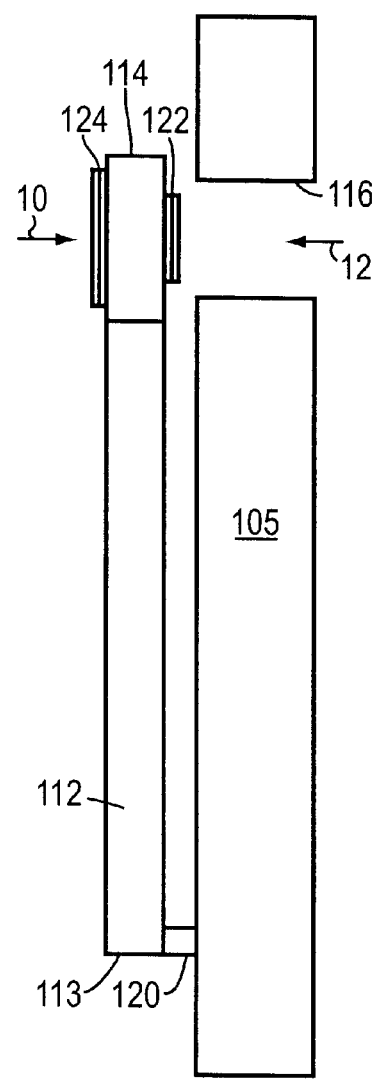
FIG.1 A    FIG.1 B    FIG. 2

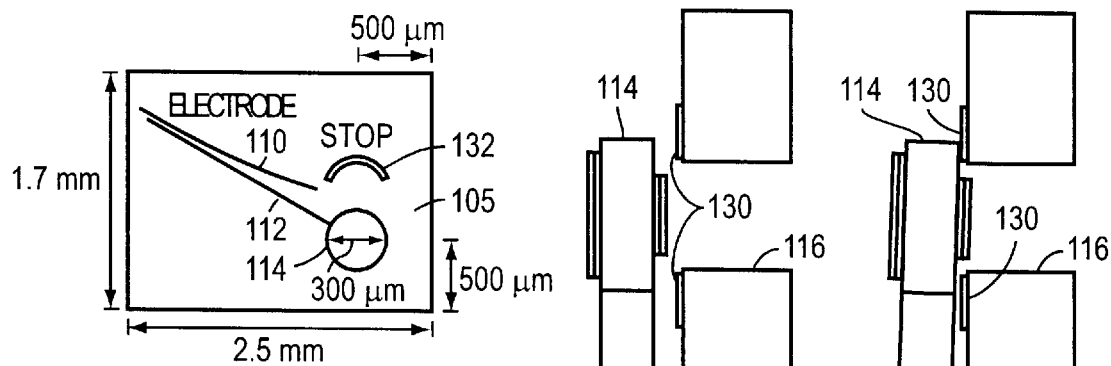
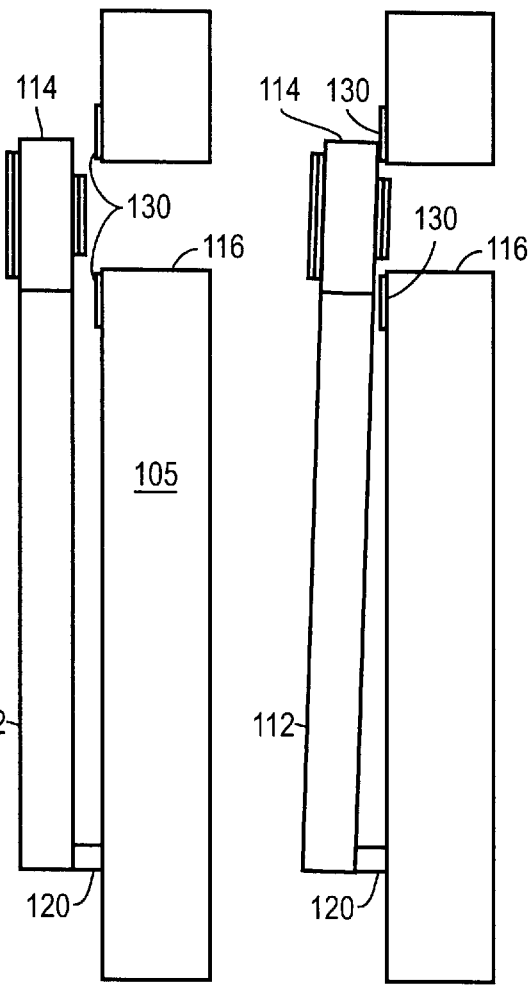
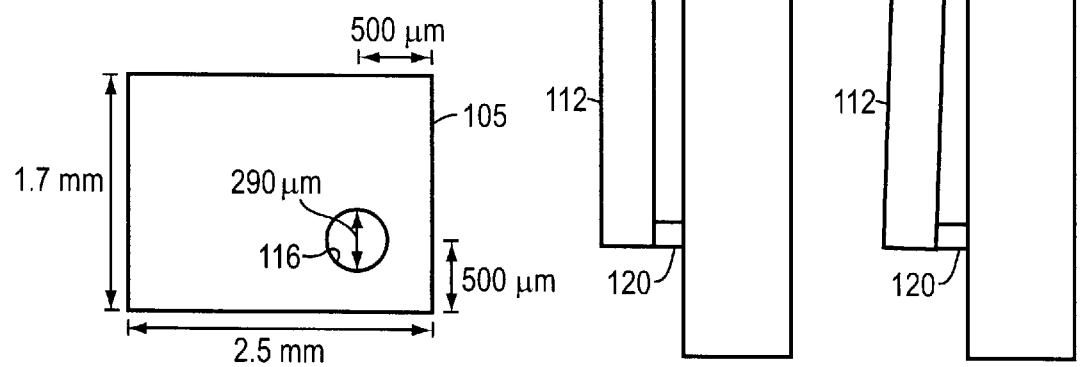
FIG. 7A
FIG. 7B
FIG. 8A
FIG. 8B

ELECTROSTATIC ZIPPER ACTUATOR OPTICAL BEAM SWITCHING SYSTEM AND METHOD OF OPERATION

BACKGROUND OF THE INVENTION

Curved electrode or flexing beam microelectromechanical systems (MEMS) actuators have been fabricated and tested for applications including optical beam and electrical switching. During operation, in response to an actuation voltage, the beam flexes to conform to the shape of the stationary electrode. These curved electrode actuators are typically classified as either out-of-plane or in-plane devices. This taxonomy is based on how the beam moves relative to the plane of the substrate.

Generally, out-of-plane devices are most common. One example is sometimes referred to as the rollershade actuator. A beam structure is fabricated on a substrate. Residual material stress in the beam structure is cultured such that the top of the beam is under compressive stress and the bottom is under tensile stress. Thus, when released from the substrate, the beam tends to curl-up. This tendency is counterbalanced by modulating a voltage between the curled beam and the substrate. The resulting electrostatic forces are used to unroll the rollershade beam so that it conforms to the flat substrate electrode.

Display devices based on two-dimensional arrays of rollershade switches have been proposed. In another application, the rollershade switches are diced into individual devices or linear arrays to function as beam switches in free-space interconnects for fiber optic systems.

In-plane devices are sometimes referred to as zipper actuators. Here, the beam flexes or moves predominantly in a direction that is parallel to the plane of the substrate. R. Legtenberg, et al., in an article entitled *Electrostatic Curved Electrode Actuators*, from *Journal of Micro-Electro-Mechanical Systems,* Vol. 6, No. 3, September 1999, characterized the behavior of zipper actuators. The paper presented design and performance information for an electrostatic actuator consisting of a laterally compliant cantilever beam and a fixed, curved electrode, which were both suspended above a ground plane. Suggested applications for these actuators included bi-stable applications, namely microswitches, microgrippers, microvalves, and micropumps.

SUMMARY OF THE INVENTION

The present invention is directed to the use of zipper actuators for optical beam control. Specifically, the invention is directed to a number of innovations to enable the zipper actuators to function as optical beam shutters and/or beam switches in free space interconnect optical systems, for example.

In general, according to one aspect, the invention features a micro-optical electromechanical system. Such systems are characterized by semiconductor-style wafer processing techniques including deep reactive ion etching, for example, and/or small size in which the optical beams are less than a few millimeters in diameter.

The inventive system comprises a substrate with an optical port. A stationary electrode is provided on substrate, along with a cantilevered beam extending from the substrate. The stationary electrode and the cantilevered beam are oriented such that an electrical field between the stationary electrode and the cantilevered beam causes the cantilevered beam to pivot toward the stationary electrode, in a plane of the substrate.

In the present implementation, a face of the stationary electrode adjacent the cantilevered beam is arcuate. In other implementations, the stationary electrode is semi-circular or circular. In still other embodiments, the stationary electrode can be straight or near straight with a straight or curved beam. During operation, in response to an electrical field, the cantilevered beam flexes toward the stationary electrode.

The optical port is preferably located relative to the cantilevered beam such that the pivoting causes the cantilevered beam to intercept an optical signal that is directed to pass through the optical port. In one implementation, the cantilevered beam acts as a shutter and/or mirror that modulates the magnitude of an optical signal transmitted through the optical port.

In general, according to another aspect, the invention again features a micro-optical electromechanical system. This system comprises a substrate and a stationary electrode on the substrate. A cantilevered beam extends from the substrate such that an electrical field between the stationary electrode and the cantilevered beam causes the cantilevered beam to pivot toward the stationary electrode in the plane of the substrate. Finally, the cantilevered beam includes a paddle for interacting with or switching an optical signal.

In the typical implementation, this paddle is simply a widened portion of the cantilevered beam. This allows the cantilevered beam to be relatively thin, and therefore flexible, to thereby reduce the required actuation voltages. In the present example, the paddle extends parallel to a plane of the substrate.

Of course, in alternative implementations, the paddle can project in a direction that is vertical or substantially vertical to a plane of the substrate. Typically, in this second example, the paddle is installed on the cantilevered beam in an assembly step, because of the difficulty of monolithically forming such a vertical structure.

In one implementation, the optical port region comprises an anti-reflection coated region of the substrate. Alternatively, the optical port region can be a hole that is formed at least partially, or completely, through the substrate. This minimizes the insertion loss associated with the system by avoiding absorption and/or reflection at the substrate. In the preferred implementation, the paddle comprises a mirror structure for reflecting an optical signal. This allows the system to switch an optical signal that is being directed through the port either back toward the source or at an angle relative to the source.

In general, according to another aspect, the invention features a micro-optical mechanical system. This system comprises a substrate having an optical port formed through the substrate and a stationary electrode on the substrate. A curved cantilevered beam extends from the substrate and wraps around the stationary electrode in a relaxed state. Electrical field between the stationary electrode and the cantilevered beam causes the cantilevered beam to curl around the stationary electrode in the plane of the substrate. This curved beam implementation is useful in applications that require more compact structure than versions with a straighter cantilevered beam.

Generally, according to still another aspect, the invention features a cantilevered beam micro-optical electromechanical system. This aspect of the invention includes a latch for holding the cantilevered beam in a fixed location relative to the substrate.

In one example, the latch is implemented as a hold-down electrode that draws the cantilevered beam to an adjacent structure, such as the substrate. Alternatively, MEMS-style latch systems can be used, such as a pawl system that locks the cantilevered beam in a stationary position, such as covering the optical port or in a position where it does not obstruct the optical port.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1A is a plan view of a zipper actuator according to a first embodiment of the present invention;

FIG. 1B is a plan view of the first embodiment zipper actuator in an actuated state;

FIG. 2 is a side view of the first embodiment of the zipper actuator;

FIGS. 7A and 7B are frontside and backside, respectively, plan views of a zipper actuator chip;

FIGS. 8A and 8B are side views of a zipper actuator with a pull down electrode latch in unactivated and activated states, respectively;

DETAILED DESCRIPTION OF THE PREFERRED EMBODIMENTS

Figure 3A:
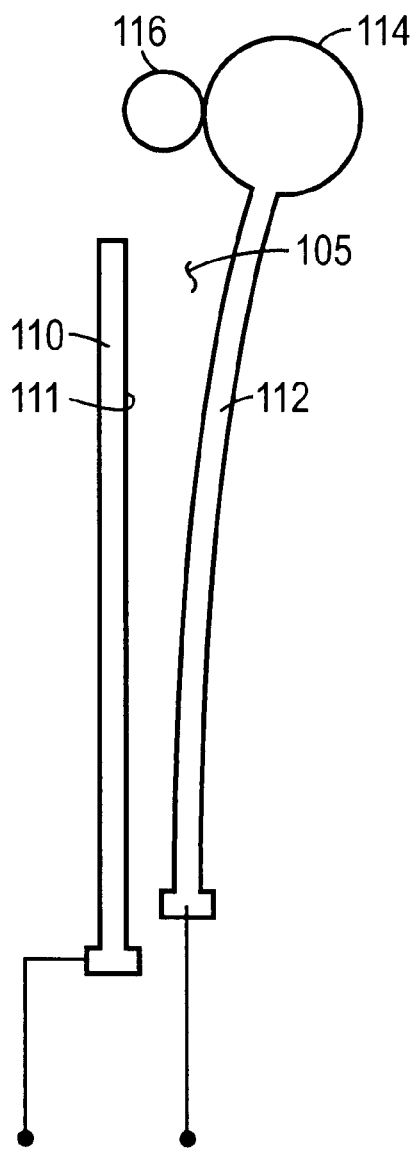
FIGS. 3A and 3B are plans view of a zipper actuator according to a second embodiment of the present invention in unactuated and actuated states, respectively.
Figure 3:
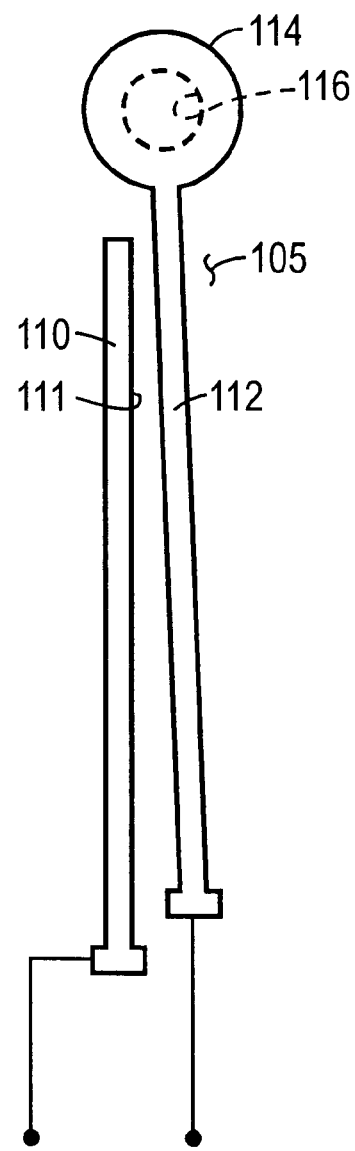

FIG. 1A illustrates a zipper actuator beam switching system, which has been constructed according to the principles of the present invention. Generally, the zipper actuator 100 comprises a stationary electrode 110, which in the illustrated example is a curved electrode. That is, face 111, adjacent a cantilevered beam 112, is curved.

A proximal end of the cantilevered beam structure 112 is supported on the substrate 105 at a base 113. In the illustrated example, the cantilevered or distal end of the cantilevered beam 112 comprises a plate or paddle 114. This paddle 114 is used to optically control an optical signal directed to propagate through an optical port region 116.

In one example, the optical port region 116 is a part of the substrate that has been antireflection (AR) coated. This implementation is common where the substrate material is transmissive at the wavelengths of interest, such as the infrared between 1000 and 2000 nanometers (nm) in wavelength, in the case of most communications systems.

Alternatively, the optical port region 116 comprises a hole that extends either partially or completely through the substrate 105. The use of an actual port through the substrate is most common where the insertion loss associated with the system 100 must be minimized.

FIG. 1B shows the zipper actuator 100 in an actuated state. Specifically, in response to an electrical potential between traces or wire bond pads 118, electrostatic forces pull and flex the cantilevered beam 112 in the direction of the stationary electrode 110 and specifically its curved face 111, such that the beam flexes to conform to the stationary electrode. In the illustrated example, this causes the paddle 114 to move away from the optical port 116 to thereby allow unobstructed transmission of an optical signal through or in the direction of the optical port 116.

In an alternative embodiment, the optical port region 116 is located to provide unobstructed transmission when the cantilevered beam structure 112 is in an unactuated state. Actuating the cantilevered beam moves the paddle 116 over the port region, in this embodiment.

FIG. 2 shows the cantilevered configuration of the beam 112. Specifically, the proximal end of the cantilevered beam structure 112 is connected to the substrate 105 at base 113 via connecting block 120. In the typical implementation, the connecting block 120 is a remnant of a sacrificial release layer that was removed to release a device layer in a release process. This device layer is patterned to form the cantilevered beam 112.

In one example, the cantilevered beam 112, base 113, and paddle 114, and possibly curved stationary electrode 110 are constructed from a silicon compound such as silicon wafer material, polysilicon, or silicon nitride. The sacrificial layer, and thus the connecting block 120, is manufactured from an insulator, such as silicon oxide.

Depending on the implementation, an optical signal, which is directed to pass through the optical port 116, can originate from either a front side (see reference numeral 10) or a backside (see reference numeral 12). In either case, depending on the state and position of the paddle 114, the beam 10, 12 is reflected/absorbed or allowed to pass and continue in the direction of the optical port 116.

If the switching system is deployed to operate as a shutter switch, absorbing material is optionally placed on the frontside and/or backside of the paddle 114. This material is used when the intrinsic transmissivity of paddle 114 is high.

In contrast, in the implementation as a switch, reflective structures 122, 124 are added to the frontside and/or backside of the paddle 114. The reflective structures 122, 124 are fabricated from metal layers, such as gold, silver, or aluminum in one embodiment. If higher reflectivities are required, thin film dielectric coatings are used. These thin film coatings are fabricated, for example, from quarter-wave thick layers of alternating high and low index dielectric material thin films.

FIGS. 3A and 3B show an alternative implementation. Here the adjacent face 111 of the stationary electrode 110 is substantially straight. The beam 112 is curved in its quiescent state (See FIG. 3A). Upon actuation, the beam 112 flexes to conform to the stationary electrode 110 in response to the electrostatic forces generated by the potential between the stationary electrode 110 and the beam 112 (See FIG. 3B).

Also illustrated is another implementation of the paddle 114. In this example, it is circular.

Figure 4A:
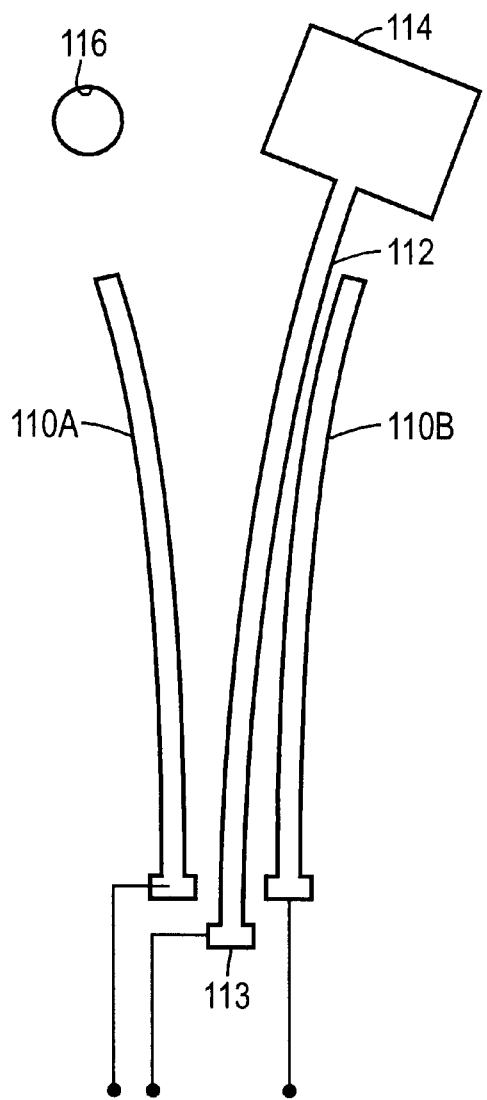
FIG. 4A is a plan view of a two stationary electrode zipper actuator in a first state.
Figure 4B:
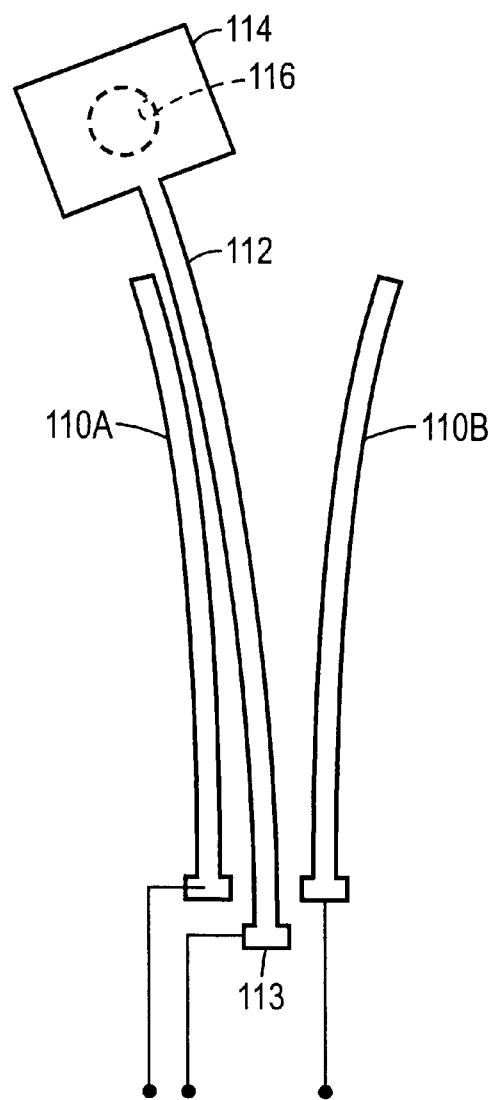
FIG. 4B is a plan view of the two stationary electrode embodiment zipper actuator in a second state.

FIGS. 4A and 4B illustrate another embodiment of the zipper actuator beam switch. In this example, two curved electrodes 110A, 110B are provided on either side of the cantilevered beam structure 112. This embodiment allows additional control of the cantilevered beam 112. For example, as illustrated in FIG. 4A, when cantilevered beam 112 is drawn against the second electrode 110B, it is held away from obstructing the optical port 116. In contrast, with reference to FIG. 4B, when the cantilevered beam 112 is pulled against the first electrode 110A, it is held in a rigid relationship over the optical port 116.

In alternative embodiment, a hinge is provided between the beam 112 and the base 113. This allows a freer pivoting movement of the beam between the two states than the illustrated embodiments, which are entirely dependent on the resiliency of the beam to provide for the throw.

Figure 5:
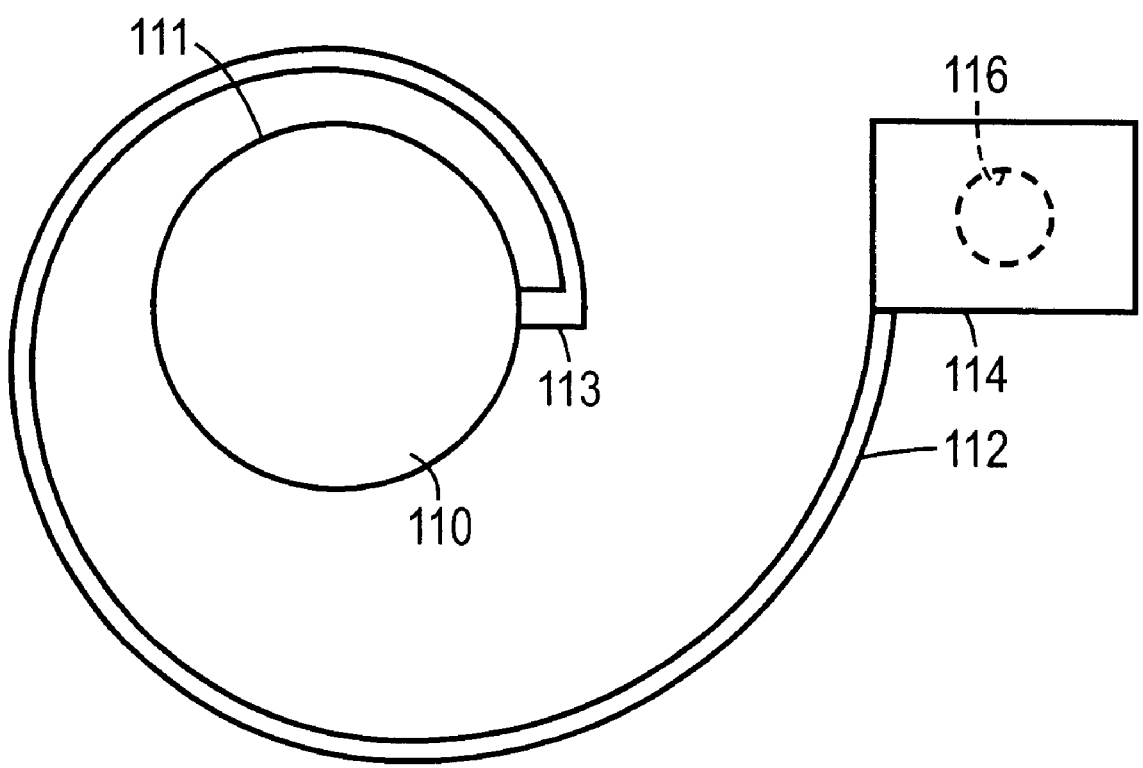
FIG. 5 is a top plan view of another embodiment of the zipper actuator.

FIG. 5 illustrates another embodiment of the present invention. In this example, the cantilevered beam structure 112 is curved or spiral in its relaxed state and specifically wrapped around a circular or arcuate stationary electrode 110. One disadvantage associated with zipper actuators surrounds the fact that they can be relatively long devices especially when large throws are required. Wrapping the cantilevered beam structure 112 around the stationary electrode 110 decreases the overall size of the device.

Figure 6:
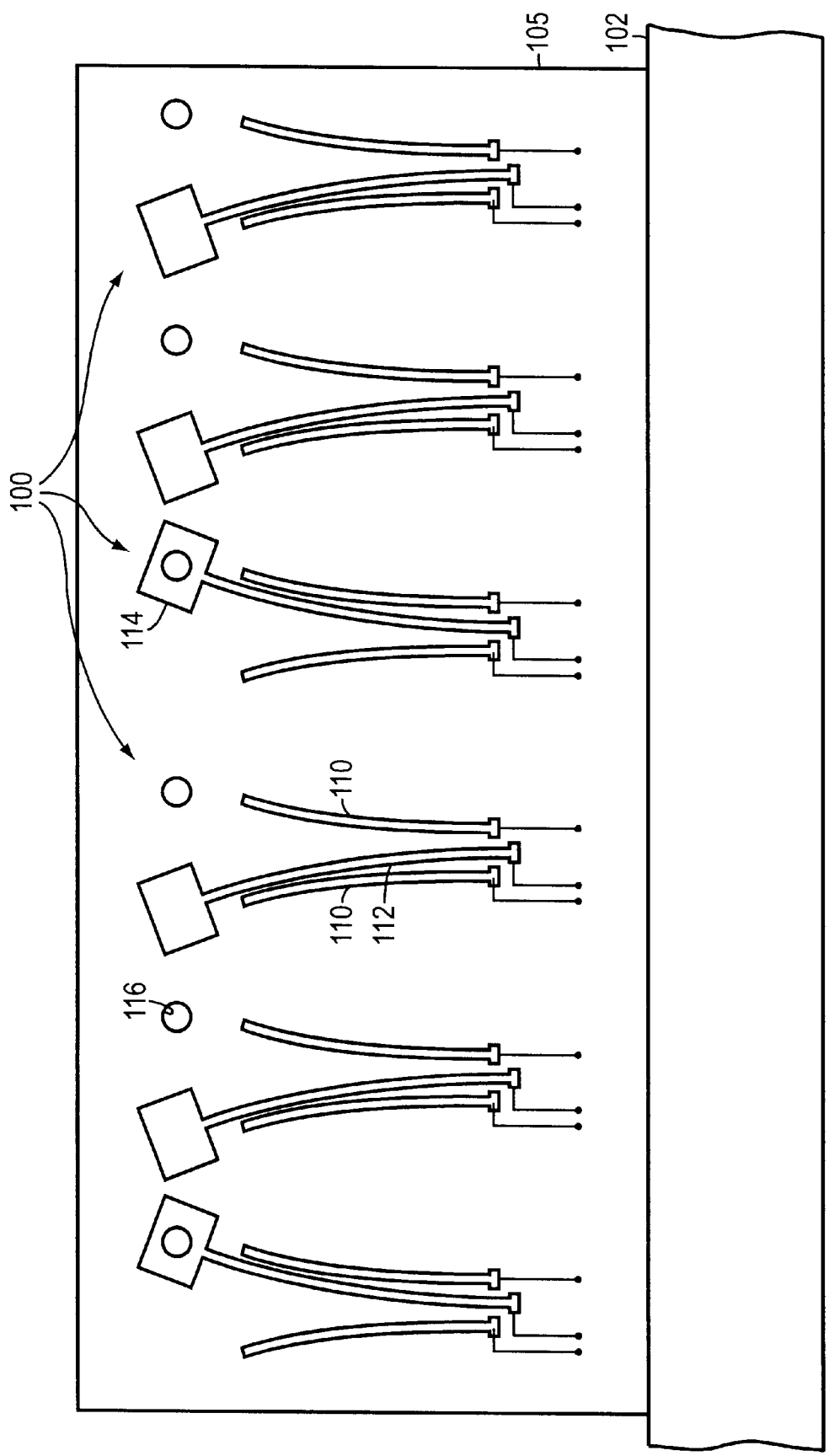
FIG. 6 is an elevational view of an array of zipper actuators installed on an optical bench.

Specifically, FIG. 6 illustrates zipper actuators in a beam switching array that have been installed "tombstone" fashion on an optical bench, i.e., installed such that the substrate 105 of the actuator projects in a direction orthogonal to a plane of an optical bench or submount 102.

Specifically, multiple zipper actuators 100 are fabricated on a common substrate 105 or chip. The substrate is preferably installed on an optical bench or submount 102, for example. The substrate 105 projects orthogonally from the plane of the optical bench 102. This allows the switching of beams that are propagating in a plane that extends parallel to the top surface of the bench 102.

FIGS. 7A and 7B illustrate a single zipper actuator 105 on a chip 105.

FIG. 7A shows the frontside. Here, the beam structure 112 extends diagonally to minimize the overall chip length and height. A stop 132 is provided to arrest the movement of the structure 112 and specifically the paddle 114 at the end of its throw. In the illustrated example the paddle is circular to minimize its mass. The paddle is typically between 100 and 500 µm in diameter, or about 300 µm in the example.

FIG. 7B shows the backside of the chip. Specifically, the port 116 is between 100 and 500 µm in diameter, specifically about 290 µm.

FIGS. 8A and 8B illustrate a version of the zipper actuator that has a latching capability. Specifically, pull-down electrodes 130 are provided on the substrate 105 to pull the cantilevered beam 112 and specifically the paddle 114 into contact with the substrate 105 (See FIG. 8B). This allows the cantilevered beam 112 to be moved to a location and then pulled against the substrate 105 to ensure that it is held rigidly at that location.

In the illustrated example, the latching electrodes 130 are provided around the periphery of the optical port 116 to allow the paddle structure 114 to be pulled down against the substrate, and therefore, latched over the optical port 116. An intervening insulating layer or an insulating standoff structure is used to prevent shorting between the paddle structure 114 and the substrate electrodes 130.

Figure 9:
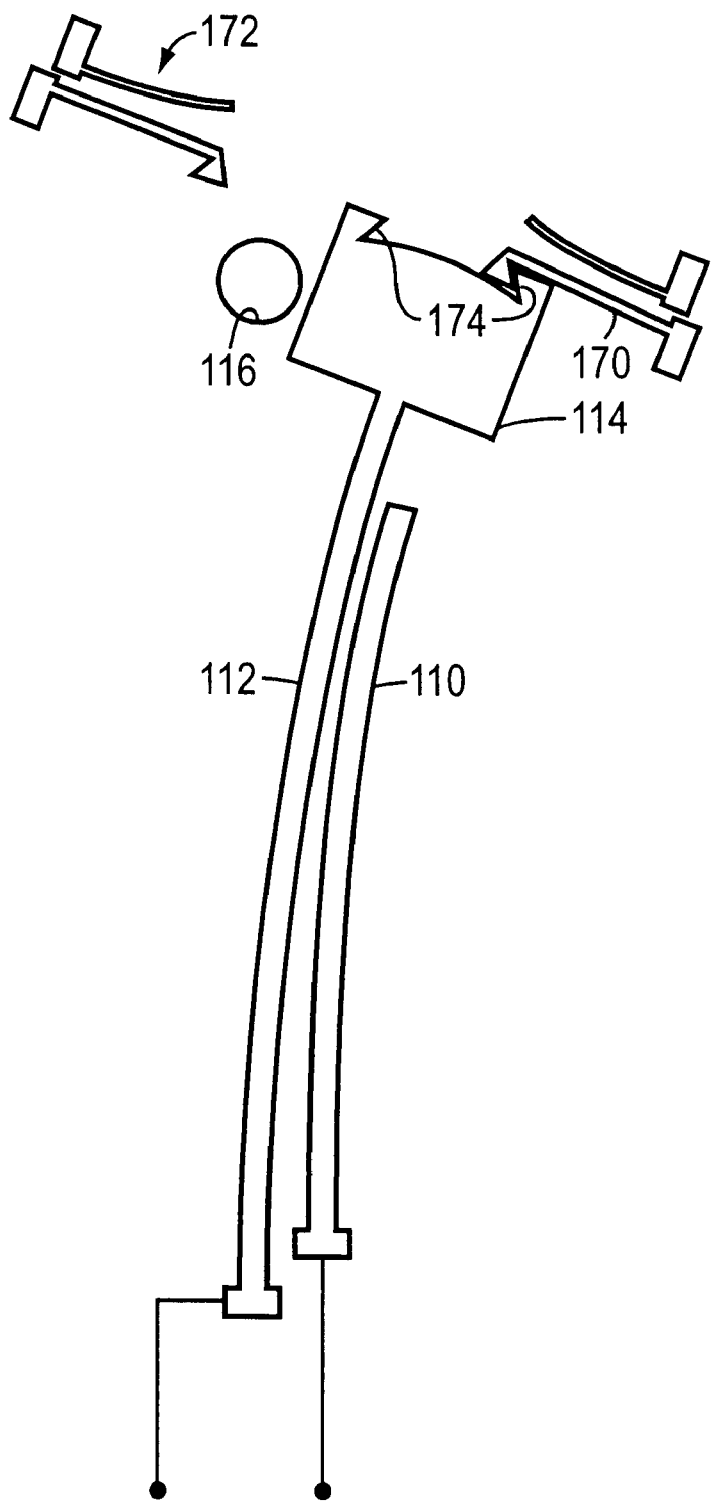
FIG. 9 is a top plan view of an embodiment of the zipper actuator with a MEMS-based pawl latching mechanism.

FIG. 9 illustrates another implementation of the latch capability. In this example, zipper actuated pawl systems 170, 172 engage notches 174 on the top of the paddle 114. This allows stable two-state operation. Specifically, pawl system 170 is used to latch the paddle 114 in an out-of-obstruction position relative to the optical port 116. In contrast, pawl system 172 is used to latch the paddle 114 over the optical port 116. In the illustrated examples, the pawl systems 170, 172 are implemented as zipper actuators with curved electrodes that are used to disengage the pawl cantilevered structures from the beam structure 114. This pawl latch system holds the paddle in position, even if the power is lost and plays a role in holding the paddle mirror rigidly and minimizing sensitivity to vibrations.

Figure 10:
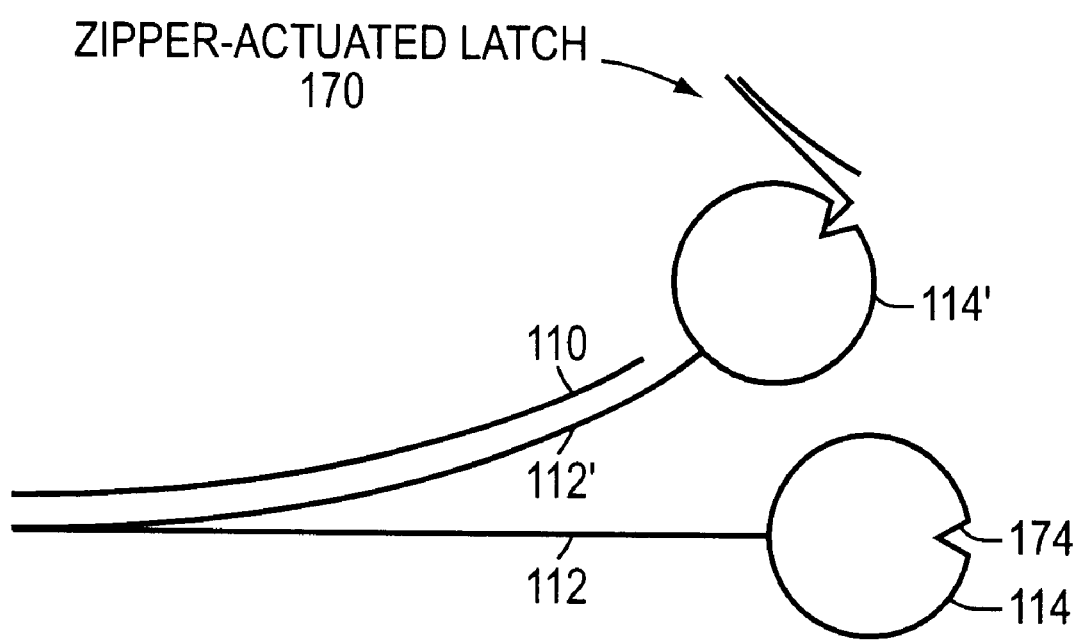
FIG. 10 is a top plan view of another embodiment of the zipper actuator with a MEMS-based pawl latching mechanism.

FIG. 10 shows a related latched implementation. In this example, the paddle 114 is round in order to decrease mass and thereby make the device faster. Also shown is the actuator in its two states, 114, 114', and a zipper actuated pawl latch 170.

Figure 11:
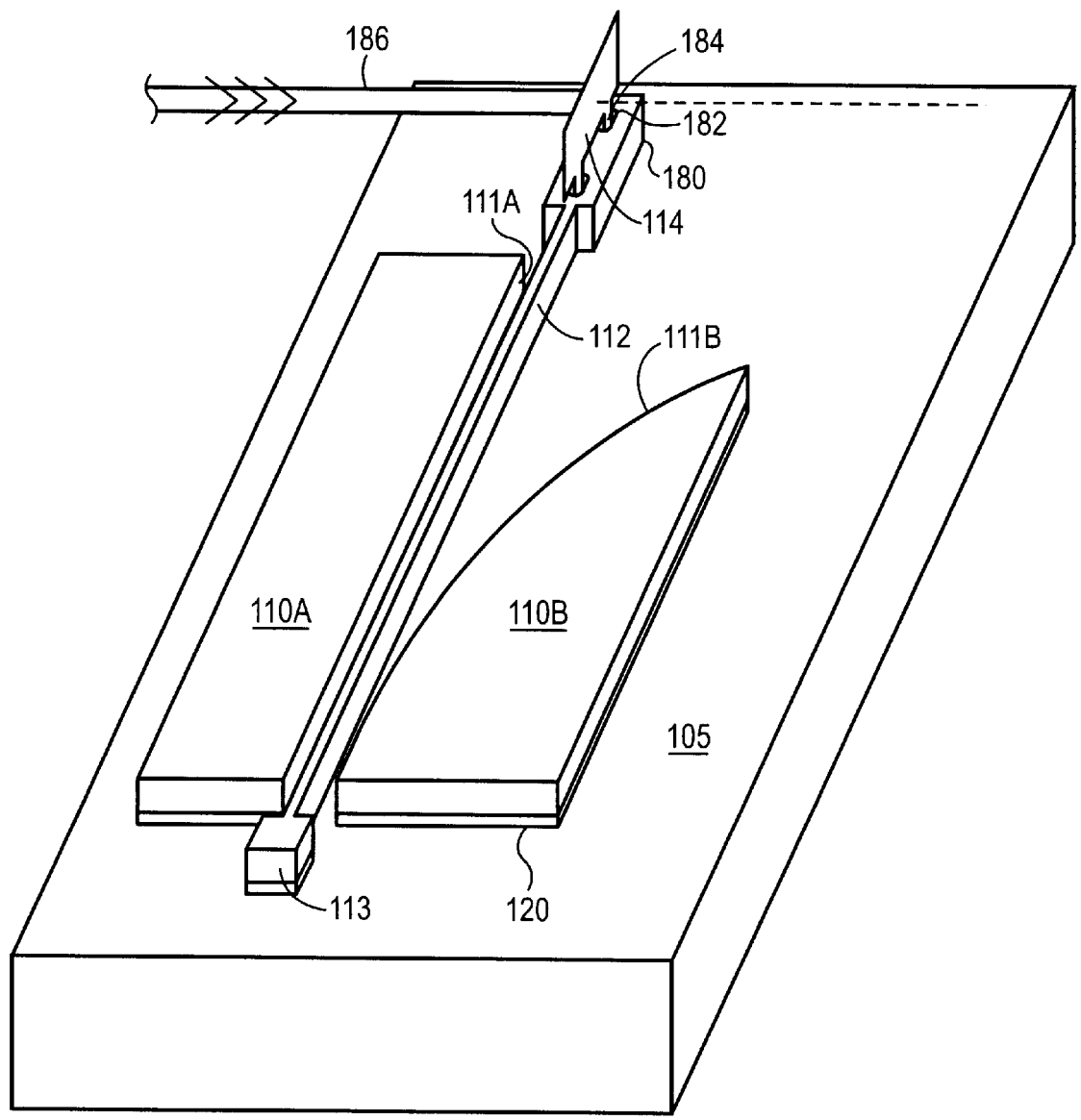
FIG. 11 is a perspective view of a two stationary electrode version with a vertical beam modulation element.

FIG. 11 shows an embodiment including an out-of-plane element. Specifically, two electrodes 110A, 110B are provided to deflect cantilevered beam 112. This beam comprises a paddle 114. This paddle 114, however, is not integrally formed with the rest of the cantilevered beam 112. Instead, in the illustrated implementation, the cantilevered beam 112 comprises an enlarged distal end 180. Slots 182 are formed in the enlarged end 180 to received tongue portions 182 of the paddle 114. Thus, during fabrication, the paddle 114 is attached to beam 114 in an assembly step.

During operation, the paddle 114 is moved in and out of an axis of beam 186. In a shutter switch application, an absorbing material is deposited on the paddle 114. In a switching application, the paddle 114 is coated to be reflective. In still another applications, the paddle 184 comprises spectral filter material, such as thin film band pass filter material, or a grating, for example, that is selectively moved in an out of the path of beam 186.

Design Considerations

The resonant frequency of the beam structure is an important design parameter since it governs speed of operation. This parameter can be calculated for a design. The spring constant of the beam (k), the mass of the plate (M), and the resonant frequency ($f_r$) are:

$$k=(EtW^3)/(4L^3)\ M=\rho At\ f_r=2\pi(k/M)^{1/2}$$

where, for silicon, $$E=160\times10^9\ Pa\ \rho=2331\ kg/m^3.$$

The table illustrates various design permutations for the actuator 100. They assume that the pull-in voltage depends on $k^{1/2}$.

TABLE 1

| Range of parameters for zipper actuator. | | | | |
|---|---|---|---|---|
| Parameter | A | B | C | D |
| Width (W) | 2 µm | 9.3 µm | 5.9 µm | 5.9 µm |
| Length (L) | 1580 µm | 1580 µm | 1580 µm | 1291 µm |

TABLE 1-continued

Range of parameters for zipper actuator.

| Parameter | A | B | C | D |
|---|---|---|---|---|
| Displacement | 300 µm | 300 µm | 300 µm | 200 µm |
| Resonance | 100 Hz | 1000 Hz | 1000 Hz | 1000 Hz |
| Paddle Size | 300 × 300 µm² | 300 × 300 µm² | 171 µm diam. | 230 µm diam. |
| Pull-in Voltage | 40 V | 400 V | 200 V | 200 V |

Column B shows a design permutation from A where the resonant frequency is made higher, i.e., one kiloHertz (kHz), by making the beam thicker. The one kHz frequency would permit responses of several milliseconds, which meets some specifications. The primary concern of this design is that the pull-in voltage scales up linearly with frequency, resulting in a high actuation voltage: 400 V.

Scaling the voltage down while holding frequency constant requires trade-offs between plate size (which sets the mass) and beam thickness (which sets the spring constant). Column C shows a design in which the beam is narrowed to achieve a 200V actuation, and the plate is shrunk in size to maintain 1 kHz resonant frequency. The plate is assumed to be circular. The Column D design has a displacement that is reduced to 200 µm, which permits the length to be scaled back. This increases the spring constant, and thus permits an increase in the plate size to 230 µm.

Generally, the resonant frequency of the system needs to be of the order of the desired step response. This means that if the paddle is pulled-in, and then released, it will relax to the un-actuated state if critically-damped in a time scale of the order of one period of the natural frequency. For a response of several milliseconds, approximately a one kHz response is needed. However, if the paddle is driven to both states by electrostatic actuators as illustrated in the embodiments of FIGS. 4 and 5, it is possible that the response time could be faster than that dictated by the resonant frequency. In that case, the resonant frequency specification could be lowered, enabling an increase in the paddle size.

Stops 132 or latches 130, 170, 172 also function as thermal shunts for the paddle 114, reducing the thermal resistance between the paddle 114 and the substrate 105. This is relevant at high optical powers and with increased absorption in the paddle. The problem arises because of the relatively long thermal path between paddle and the substrate along the beams without a shunt.

In one implementation, the paddle 114 is thinner than the beam 112. This allows optimization of the actuation voltage/frequency tradeoff in such a way that the system specifications are more readily achieved, at the expense of fabrication complexity. Further, presently, a 10 to 40 micrometer thick device layer is used, preferably between 20 and 30 micrometers thick. The sacrificial release layer is between 1 and 5 micrometers thick.

While this invention has been particularly shown and described with references to preferred embodiments thereof, it will be understood by those skilled in the art that various changes in form and details may be made therein without departing from the scope of the invention encompassed by the appended claims.

What is claimed is:

1. A micro-optical electromechanical system, comprising:
   a substrate having an optical port formed through the substrate;
   a stationary electrode on the substrate; and
   a cantilevered beam extending from the substrate wherein an electric field between the stationary electrode and the cantilevered beam causes the cantilevered beam to pivot toward the stationary electrode in a plane of the substrate;
   wherein the optical port is located relative to the cantilevered beam such that pivoting causes the cantilevered beam to intercept an optical signal that is directed to pass through the optical port.

2. A micro-optical electromechanical system as claimed in claim 1, wherein a face of the stationary electrode adjacent the cantilevered beam is arcuate.

3. A micro-optical electromechanical system as claimed in claim 1, wherein the stationary electrode is semicircular or circular.

4. A micro-optical electromechanical system as claimed in claim 1, wherein cantilevered beam flexes toward the stationary electrode in response to the electric field.

5. A micro-optical electromechanical system as claimed in claim 1, wherein the beam modulates a magnitude of the optical signal transmitted though the optical port.

6. A micro-optical electromechanical system, comprising:
   a substrate;
   a stationary electrode on the substrate;
   a cantilevered beam extending from the substrate wherein an electric field between the stationary electrode and the cantilevered beam causes the cantilevered beam to pivot toward the stationary electrode in a plane of the substrate; and
   a paddle of the cantilevered beam for modulating an optical signal;
   wherein the paddle moves relative to an optical port region of the substrate to switch an optical signal that is directed to pass though the optical port region.

7. A micro-optical electromechanical system as claimed in claim 6, wherein the paddle extends parallel to the substrate.

8. A micro-optical electromechanical system as claimed in claim 6, wherein the optical port region comprises an antireflective coated region of the substrate.

9. A micro-optical electromechanical system as claimed in claim 8, wherein the optical port region comprises a hole formed at least partially through the substrate.

10. A micro-optical electromechanical system as claimed in claim 8, wherein the optical port region comprises a hole formed through the substrate.

11. A micro-optical electromechanical system as claimed in claim 6, wherein the paddle comprises a mirror structure for reflecting the optical signal.

12. A micro-optical electromechanical system as claimed in claim 6, wherein the mirror structure comprises a metal layer.

13. A micro-optical electromechanical system as claimed in claim 12, wherein the mirror structure comprises a thin film dielectric stack.

14. A micro-optical electromechanical system, comprising:
   a substrate having an optical port formed through the substrate;
   a stationary electrode on to substrate; and
   a curved cantilevered beam extending from the substrate and wrapping wound the stationary electrode in a relaxed state, wherein an electric field between the stationary electrode and the cantilevered beam causes the cantilevered beam to curl wound the stationary electrode in a plane of the substrate.

15. A micro-optical electromechanical system as claimed in claim 14, wherein the stationary electrode has spiral shape.

16. A micro optical electromechanical system, comprising:
- a substrate;
- a stationary electrode on the substrate; and
- a cantilevered beam extending from the substrate, wherein an electric field between the stationary electrode and the cantilevered beam causes the cantilevered beam to pivot toward the stationary electrode in a plane of the substrate; and
- a latch holding the cantilevered beam in a fixed location relative to the substrate.

17. A micro-optical electromechanical system as claimed in claim 16, wherein the latch comprises a substrate electrode for pulling the cantilevered beam toward the substrate.

18. A micro-optical electromechanical system as claimed in claim 16, wherein the latch comprises an electrode for pulling the cantilevered beam toward the substrate over an optical port region.

19. A micro-optical electromechanical system as claimed in claim 16, further comprising a paddle on the cantilevered beam for selectively covering an optical port region in response to pivoting of the cantilevered beam.

20. A micro-optical electromechanical system as claimed in claim 16, wherein the paddle comprises a mirror structure for reflecting the optical signal.

21. A micro-optical electromechanical system as claimed in claim 16, wherein the latch engages the cantilevered beam to hold the cantilevered beam.

22. A micro-optical electromechanical system as claimed in claim 16, further comprising a latch release mechanism disengaging the latch from the cantilevered beam.

23. A micro-optical electromechanical system, comprising:
- a substrate;
- a stationary electrode on the substrate;
- a cantilevered beam extending from the substrate wherein an electric field between the stationary electrode and the cantilevered beam causes the cantilevered beam to pivot toward the stationary electrode in a plane of the substrate; and
- a paddle, that is attached to the cantilevered beam, the paddle extending at least partially orthogonally to the substrate and away from the cantilevered beam to interact with an optical signal traveling above the cantilevered beam.

24. A micro-optical electromechanical system as claimed in claim 23, wherein the paddle comprises filter material.

25. A micro-optical electromechanical system as claimed in claim 23, wherein the paddle comprises a mirror structure.

26. A micro-optical electromechanical system as claimed in claim 23, wherein the paddle comprises a grating.

* * * * *